US012589393B2

(12) United States Patent
Liu et al.

(10) Patent No.: US 12,589,393 B2
(45) Date of Patent: Mar. 31, 2026

(54) MICROFLUIDIC CHIP

(71) Applicant: BOE TECHNOLOGY GROUP CO., LTD., Beijing (CN)

(72) Inventors: Haonan Liu, Beijing (CN); Yudan Yin, Beijing (CN); Ding Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1022 days.

(21) Appl. No.: 17/606,695

(22) PCT Filed: Feb. 5, 2021

(86) PCT No.: PCT/CN2021/075518
§ 371 (c)(1),
(2) Date: Oct. 26, 2021

(87) PCT Pub. No.: WO2022/165751
PCT Pub. Date: Aug. 11, 2022

(65) Prior Publication Data
US 2023/0137571 A1     May 4, 2023

(51) Int. Cl.
B01L 3/00       (2006.01)
B81B 1/00       (2006.01)

(52) U.S. Cl.
CPC ........ B01L 3/502746 (2013.01); B81B 1/006 (2013.01); *B01L 2300/0654* (2013.01);
(Continued)

(58) Field of Classification Search
CPC ......... B01L 3/502715; B01L 3/502746; B01L 2300/0645; B01L 2300/0816;
(Continued)

(56) References Cited

U.S. PATENT DOCUMENTS 3,744,975 A    7/1973   Mailen
5,160,702 A    11/1992   Kopf-Sill et al.
(Continued)

FOREIGN PATENT DOCUMENTS

CN      102199529 A    9/2011
CN      205157567 U    4/2016
(Continued)

OTHER PUBLICATIONS

Complete Specification for IN60MUMNP2008 entitled "Microfluidic Devices and Methods of Preparing and Using the Same", filed Jan. 10, 2008, 66 pages.
(Continued)

*Primary Examiner* — Dean Kwak
(74) *Attorney, Agent, or Firm* — Myers Bigel, P.A.

(57) ABSTRACT

The present disclosure relates to a microfluidic chip. The microfluidic chip includes a first substrate, and the first substrate includes a sample input hole and a reaction region located downstream of the sample input hole. The reaction region includes at least one groove, an orthographic projection of each groove on the first substrate is an axisymmetric pattern, a width of the axisymmetric pattern in a first direction is not less than a width of the axisymmetric pattern in a second direction, and the first direction is perpendicular to the second direction.

19 Claims, 6 Drawing Sheets

(52) U.S. Cl.
CPC . *B01L 2300/087* (2013.01); *B01L 2300/0883* (2013.01); *B81B 2201/051* (2013.01); *B81B 2203/033* (2013.01); *B81B 2203/0338* (2013.01)

(58) Field of Classification Search
CPC ....... B01L 2300/0819; B01L 2300/161; B01L 2400/0415; B01L 3/502761; B01L 2200/10; B01L 3/502792; B01L 2200/16; B01L 3/5027; B01L 2300/0636; B01L 3/50273; B01L 2200/0668; B01L 2300/0861; B01L 2300/0877; B01L 2300/0883; B01L 2400/043; B01L 2400/0487; B01L 2300/087; B01L 2300/088; B01L 2300/12; B01L 2300/165; B01L 2300/18; B01L 2400/0427; B01L 3/00; B01L 9/527; B01L 2200/027; B01L 2200/0647; B01L 2200/0652; B01L 2200/0684; B01L 2300/08; B01L 2300/0829; B01L 2300/0864; B01L 2300/168; B01L 2400/022; B01L 2400/0418; B01L 2400/0421; B01L 2400/0475; B01L 2400/084; B01L 2400/086; B01L 3/50857; B01L 7/52; B01L 2200/028; B01L 2200/0689; B01L 2300/027; B01L 2300/06; B01L 2300/0609; B01L 2300/0627; B01L 2300/0851; B01L 2300/0858; B01L 2400/0406; B01L 3/502723; B01L 3/502753; B01L 3/502784; G01N 27/226; G01N 33/5438; G01N 2015/1415; G01N 15/1484; G01N 2021/0346

See application file for complete search history.

(56) References Cited

U.S. PATENT DOCUMENTS

| | | | |
|---|---|---|---|
| 5,300,779 A | 4/1994 | Hillman et al. |
| 5,976,896 A | 11/1999 | Kumar et al. |
| 10,228,367 B2 | 3/2019 | Stanwood et al. |
| 2002/0097632 A1 | 7/2002 | Kellogg et al. |
| 2006/0159592 A1 | 7/2006 | Andersson et al. |
| 2008/0138248 A1 | 6/2008 | Viovy et al. |
| 2010/0062414 A1 | 3/2010 | Yamamoto et al. |
| 2010/0216126 A1 | 8/2010 | Balachandran et al. |
| 2010/0261286 A1* | 10/2010 | Kim ................. B01L 3/502707 |
| | | | 422/69 |
| 2014/0011707 A1 | 1/2014 | Ye et al. |
| 2015/0202626 A1 | 7/2015 | Huang |
| 2016/0047735 A1 | 2/2016 | Grisham et al. |
| 2019/0299207 A1 | 10/2019 | Lee et al. |
| 2020/0093416 A1 | 3/2020 | Rogers et al. |

FOREIGN PATENT DOCUMENTS

| | | | |
|---|---|---|---|
| CN | 108398559 A | 8/2018 |
| CN | 108786940 A | 11/2018 |
| CN | 108956558 A | 12/2018 |
| CN | 208642696 U | 3/2019 |
| CN | 109870567 A | 6/2019 |
| CN | 110186835 A | 8/2019 |
| CN | 110343604 A | 10/2019 |
| CN | 110632168 A | 12/2019 |
| EP | 3462162 A1 | 4/2019 |
| GB | 2341924 A | 3/2000 |
| WO | 0187487 A2 | 11/2001 |
| WO | 0187487 A3 | 4/2002 |
| WO | 2008126403 A1 | 10/2008 |
| WO | 2018223044 A1 | 12/2018 |

OTHER PUBLICATIONS

Extended European Search Report for EP Application No. 21923768.2 mailed Jul. 5, 2023, 9 pages.

First Office Action for CN 202180000145X mailed May 30, 2023, with translation, 12 pages.

Lei, Kin Fong , et al., "Paper/PMMA Hybrid 3D Cell Culture Microfluidic Platform for the Study of Cellular Crosstalk", ACS Applied Materials & Interfaces, vol. 9, No. 15, Mar. 29, 2017, pp. 13092-13101.

* cited by examiner

100

100

10

201        202

A                    A

200

203        204

201                    202

200

203    301            302    204

200

MICROFLUIDIC CHIP

TECHNICAL FIELD

The present disclosure relates to the field of biological detection, in particular to a microfluidic chip.

BACKGROUND

Microfluidics is a technology for precise control and manipulation of micro-scale fluids. In this technology, the basic operation units such as sample preparation, reaction, separation, and detection involved in the detection and analysis process can be integrated into a centimeter-level chip. Microfluidic technology is generally applied to the analysis process of trace drugs in the fields of biology, chemistry, medicine, etc. Microfluidic devices have advantages such as low sample consumption, fast detection speed, simple operation, multi-functional integration, small size and portability, and have huge application potential in the fields of biology, chemistry, medicine, etc.

SUMMARY

According to an aspect of the present disclosure, a microfluidic chip is provided. The microfluidic chip comprises a first substrate, the first substrate comprising: a sample input hole and a reaction region located downstream of the sample input hole, wherein the reaction region comprises at least one groove, an orthographic projection of each groove on the first substrate is an axisymmetric pattern, a width of the axisymmetric pattern in a first direction is not less than a width of the axisymmetric pattern in a second direction, and the first direction is perpendicular to the second direction.

In some embodiments, the reaction region comprises at least two grooves, and orthographic projection shapes of the at least two grooves on the first substrate are different.

In some embodiments, the reaction region comprises at least two grooves, and orthographic projection shapes of the at least two grooves on the first substrate are same.

In some embodiments, the orthographic projection of the reaction region on the first substrate comprises a first axisymmetric pattern and a second axisymmetric pattern, and a width of the first axisymmetric pattern in the first direction is less than a width of the second axisymmetric pattern in the first direction.

In some embodiments, a width of the first axisymmetric pattern in the second direction is greater than a width of the second axisymmetric pattern in the second direction.

In some embodiments, the axisymmetric figure comprises a polygon and a circle.

In some embodiments, an end of the axisymmetric pattern close to the sample input hole comprises a semicircular ring shape.

In some embodiments, the first substrate further comprises a mixing region located downstream of the sample input hole, and the mixing region comprises a serpentine flow channel.

In some embodiments, the reaction region comprises a first groove and a second groove, and the mixing region comprises a first mixing region located upstream of the first groove and a second mixing region located upstream of the second groove.

In some embodiments, a length of a flow channel of the second mixing region is greater than a length of a flow channel of the first mixing region.

In some embodiments, the first substrate further comprises a waste liquid region and a sample output hole, the waste liquid region being downstream of the reaction region and upstream of the sample output hole.

In some embodiments, an orthographic projection of the waste liquid region on the first substrate is a rectangle.

In some embodiments, the microfluidic chip further comprises: a second substrate disposed opposite to the first substrate, the second substrate being provided with an opening penetrating the second substrate, and an orthographic projection of the opening on the first substrate at least partially overlap with the orthographic projection of the reaction region on the first substrate; and a cover plate, the orthographic projection of the opening on the first substrate being within an orthographic projection of the cover plate on the first substrate.

In some embodiments, the orthographic projection of the reaction region on the first substrate is within the orthographic projection of the opening on the first substrate.

In some embodiments, the orthographic projection of the opening on the first substrate is within the orthographic projection of the reaction region on the first substrate.

In some embodiments, an orthographic projection of two opposite edges of the reaction region in the second direction on the first substrate along the first direction coincides with an orthographic projection of two opposite edges of the opening in the second direction on the first substrate along the first direction.

In some embodiments, a surface of the second substrate facing away from the first substrate is provided with a recess, the orthographic projection of the opening on the first substrate is within an orthographic projection of the recess on the first substrate, and the cover plate is in the recess.

In some embodiments, the orthographic projection of the opening on the first substrate comprises a square.

In some embodiments, a material of the cover plate comprises a chemically modified material.

In some embodiments, a surface of the second substrate facing the first substrate and a surface of the cover plate facing the first substrate are in a same plane.

In some embodiments, a surface of the second substrate facing the first substrate and a surface of the cover plate facing the first substrate are not in a same plane.

In some embodiments, the recess of the second substrate comprises arc-shaped edges on opposite sides of the opening.

BRIEF DESCRIPTION OF THE DRAWINGS

In order to more clearly illustrate the technical solutions in embodiments of the disclosure, the drawings needed to be used in the description of the embodiments will be introduced briefly in the following. Obviously, the drawings in the following description are only some embodiments of the disclosure, and for those of ordinary skills in the art, other drawings may be obtained according to these drawings under the premise of not paying out creative work.

Figure 1:
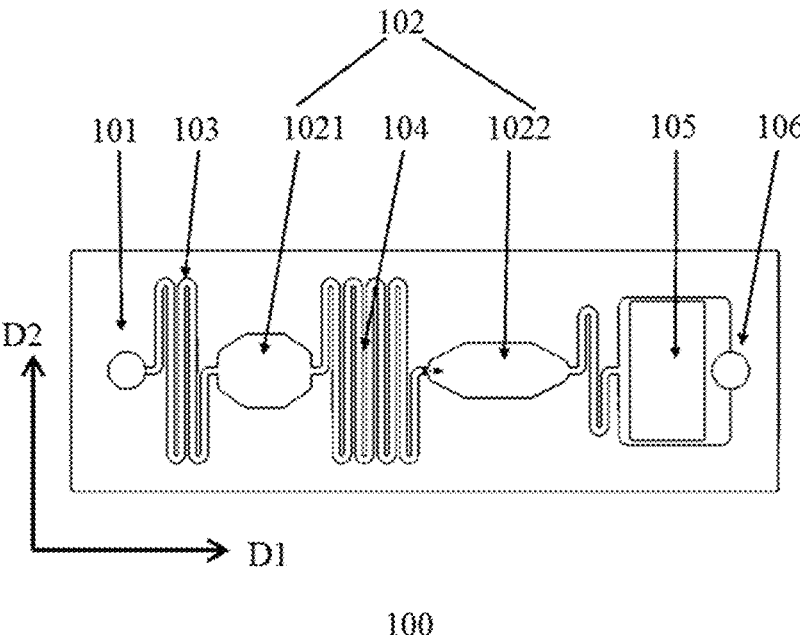
FIG. 1 schematically shows a top view of a first substrate according to an embodiment of the present disclosure.

The shapes and sizes of the parts in the drawings do not reflect the true proportions of the parts, but merely schematically illustrate the present disclosure.

DETAILED DESCRIPTION OF THE DISCLOSURE

The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments in the present disclosure, all other embodiments obtained by those of ordinary skill in the art without creative work shall fall within the protection scope of the present disclosure.

The inventor found that the existing immunoassay microfluidic chips usually use polymer or glass substrates. Compared with glass substrates, polymer substrates are easier to form flow channels and reaction regions required for immune reactions. However, the disadvantage of polymers is the surface chemical modification is difficult to complete. If two substrates are both polymer substrates, the antibody needs to be freeze-dried and stored first, and then the two substrates are bonded by thermocompression. The thermocompression process will affect the antibody. If a polymer substrate and a glass substrate are used for the two substrates, there will be a problem of difficulty in bonding. Meanwhile, during the use of a conventional microfluidic chip, when the liquid flows through the reaction region, bubbles are easily generated, resulting in nonuniform or insufficient reaction, which affects the detection result of the microfluidic chip.

The present disclosure provides a microfluidic chip including a first substrate. FIG. 1 schematically shows a top view of a first substrate 100 according to an embodiment of the present disclosure. As shown in FIG. 1, the first substrate 100 may include: a sample input hole 101 and a reaction region 102 located downstream of the sample input hole 101. The reaction region 102 includes at least one groove, and an orthographic projection of each groove on the first substrate is an axisymmetric pattern, a width of the axisymmetric pattern in a first direction D1 is not less than a width of the axisymmetric pattern in a second direction D2, and the first direction D1 is perpendicular to the second direction D2. It should be noted that the first direction in the present disclosure refers to the direction in which the liquid flows when passing through the reaction region during the use of the microfluidic chip, and the second direction refers to the direction perpendicular to the direction in which the liquid flows in the reaction region. In some embodiments, as shown in FIG. 1, the reaction region includes a first groove 1021 and a second groove 1022, an orthographic projection of the first groove 1021 on the first substrate is a first axisymmetric pattern, the first axisymmetric pattern has a first symmetry axis (along the first direction D1 in FIG. 1), an orthographic projection of the second groove 1022 on the first substrate is a second axisymmetric pattern, and the second axisymmetric pattern has a second symmetry axis (also along the first direction D1 in FIG. 1). It should be noted that the first symmetry axis and the second symmetry axis are in the same direction is only exemplary, and in some embodiments, there may be an included angle between the first symmetry axis and the second symmetry axis. More specifically, for an embodiment in which the reaction region includes more grooves, the included angles between the symmetry axes of the various axisymmetric patterns may be the same or different.

By designing an elongated reaction region, the liquid can have a smaller advancing surface, which is beneficial to reduce bubbles, facilitate the sample to pass through the reaction region more uniformly, and improve the detection effect.

In some embodiments, the reaction region may include at least two grooves, and orthographic projection shapes of the at least two grooves on the first substrate may be different. For example, as the first groove 1021 and the second groove 1022 that are schematically shown in FIG. 1, the shape of the first groove 1021 and the shape of the second groove 1022 may be different. The orthographic projection of the first groove 1021 on the first substrate is a first axisymmetric pattern, and the orthographic projection of the second groove 1022 on the first substrate is a second axisymmetric pattern. In some embodiments, the width of the first axisymmetric pattern in the first direction D1 is less than the width of the second axisymmetric pattern in the first direction D1. In some embodiments, the width of the first axisymmetric pattern in the second direction D2 is greater than the width of the second axisymmetric pattern in the second direction D2.

In some embodiments, the reaction region may include at least two grooves, and the orthographic projection shapes of the at least two grooves on the first substrate may be the same.

In some embodiments, the axisymmetric patterns may include polygons, circles, spindles, etc. Those skilled in the art can reasonably design the shape and size of the reaction region according to actual needs, which is not specifically limited in the present disclosure.

Figure 2:
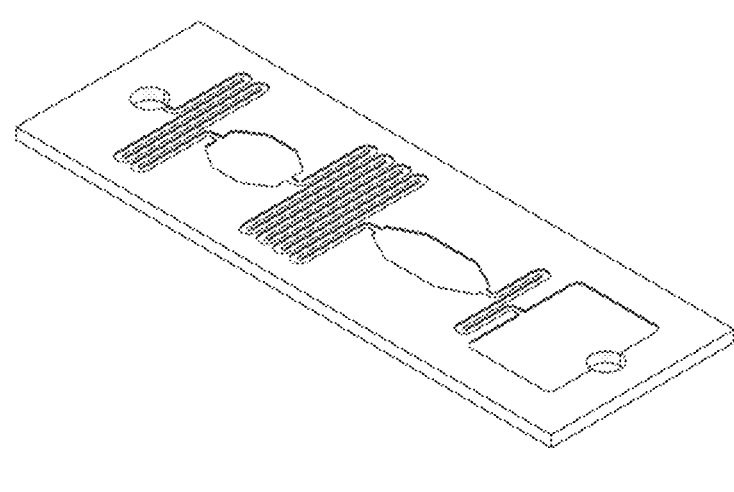
FIG. 2 schematically shows a stereoscopic structure diagram of a first substrate according to an embodiment of the present disclosure.
Figure 3:
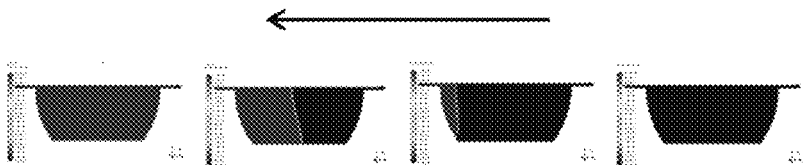
FIG. 3 schematically shows a diagram of a simulation result of sample input of a microfluidic chip according to an embodiment of the present disclosure.

FIG. 1 exemplarily shows a hexagonal-shaped reaction region. Such a reaction region can effectively reduce bubbles generated during liquid flow and make the flow of reactants more uniform. FIG. 2 schematically shows a stereoscopic structure diagram of a first substrate according to an embodiment of the present disclosure. FIG. 3 shows a diagram of the simulation result of sample input of the microfluidic chip according to an embodiment of the present disclosure. The direction indicated by the arrow in the figure is the direction of liquid flow. From the simulation results, it can be seen that no bubbles are generated during the liquid advancement, the liquid flows uniformly.

Figure 4:
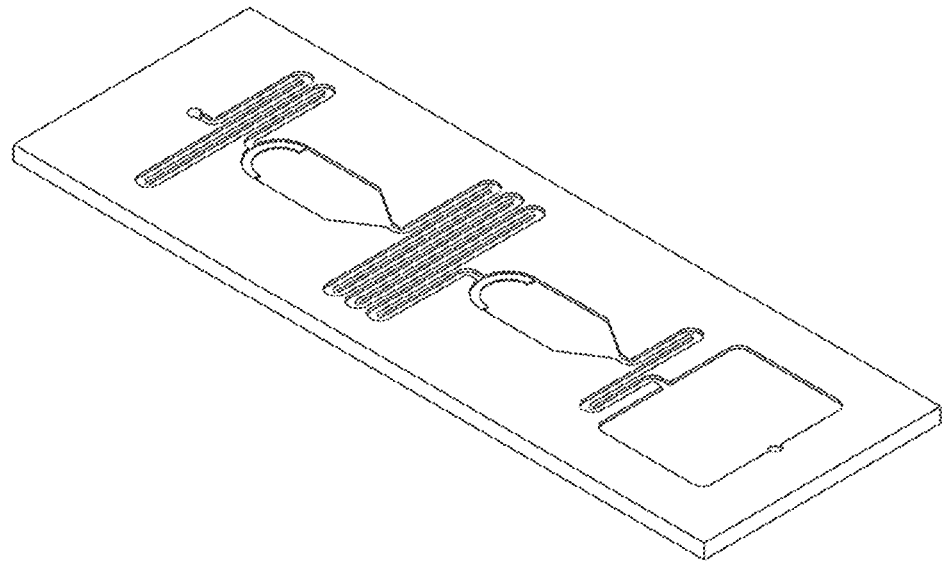
FIG. 4 schematically shows a stereoscopic structure diagram of a first substrate according to an embodiment of the present disclosure.

In some embodiments, an end of the reaction region close to the sample input hole may include a semicircular ring shape. As shown in FIG. 4, the end 1023 of the first reaction groove 1021 may have a semicircular ring shape, the end 1024 of the groove 1022 may have a semicircular ring shape. This design can further reduce the bubbles in the reaction region, make the liquid advancing surface nearly flat, make the liquid flow more uniform, and further improve the detection accuracy of the microfluidic chip.

Referring back to FIG. 1, the first substrate 100 may further include a mixing region located downstream of the sample input hole 101, such as a first mixing region 103 located upstream of the first groove 1021 and a second mixing region 104 located upstream of the second groove 1022, as shown in FIG. 1, the mixing region may include a serpentine flow channel. The serpentine flow channel can make the design of the flow channel more compact, provide a longer flow channel on a limited chip area, and make the reactants more fully mixed to be uniform.

In some embodiments, as shown in FIG. 1, the flow channel length of the second mixing region 104 is greater than the flow channel length of the first mixing region 103, which can make the sample from the first groove 1021 of the reaction region 102 reacts more fully before it enters the second groove 1022 of the reaction region 102 for subsequent reactions.

In some embodiments, as shown in FIG. 1, the first substrate 100 may further include a waste liquid region 105 and a sample output hole 106. The waste liquid region 105 is located downstream of the reaction region 102 and located upstream of sample output hole 106. After the reaction in the microfluidic chip is completed, the buffer can be pumped from the sample input hole to wash away the unreacted antibodies. The waste liquid region is configured to collect the waste liquid that cleans reaction region to avoid the influence on the detection results. Exemplarily, the waste liquid region may have a rectangular shape as shown in FIG. 1.

Figure 5:
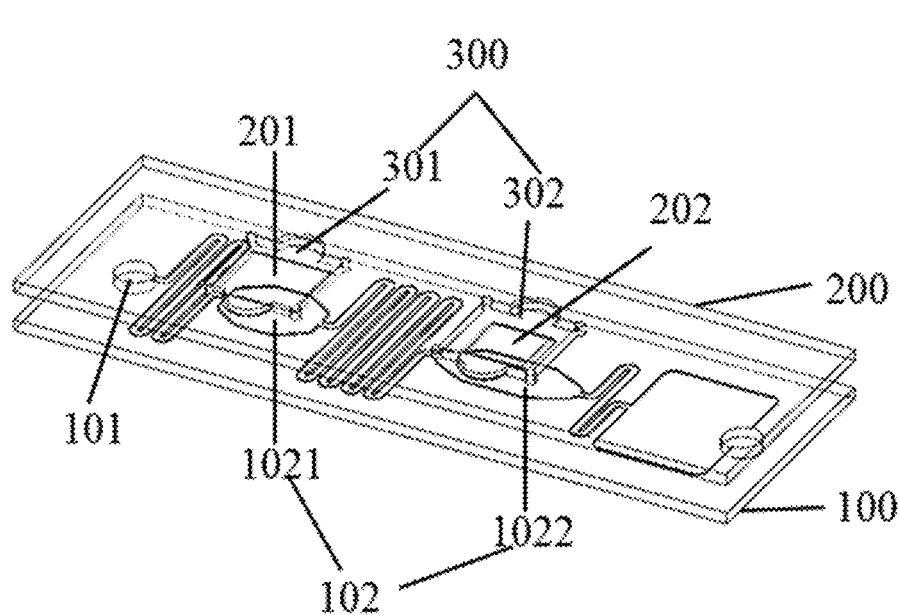
FIG. 5 schematically shows a stereoscopic structure diagram of a microfluidic chip according to an embodiment of the present disclosure.

FIG. 5 schematically shows a stereoscopic structural diagram of a microfluidic chip 10 according to an embodiment of the present disclosure. As shown in FIG. 5, the microfluidic chip 10 may further include: a second substrate 200 disposed opposite to the first substrate 100, the second substrate 200 is provided with openings (for example, the first opening 201 and the second opening 202), the openings penetrate the second substrate, and the orthographic projection of the openings on the first substrate and the orthographic projections of the reaction region on the first substrate at least partially overlap (for example, the first opening 201 corresponds to the first groove 1021 of the reaction region, the second opening 202 corresponds to the second groove 1022 of the reaction region, the orthographic projection of the first opening 201 on the first substrate and the orthographic projection of the first groove 1021 of the reaction region on the first substrate at least partially overlap, the orthographic projection of the second opening 202 on the first substrate and the orthographic projection of the second groove 1022 of the reaction region on the first substrate at least partially overlap); and cover plates 300 (for example, the first cover plate 301 and the second cover plate 302), the orthographic projections of the openings on the first substrate is within the orthographic projections of the cover plates on the first substrate (for example, the first cover plate 301 covers the first opening 201, the second cover plate 302 covers the second opening 202, the orthographic projection of the first opening 201 on the first substrate is within the orthographic projection of the first cover plate 301 on the first substrate, and the orthographic projection of the second opening 202 is on the first substrate is within the orthographic projection of the second cover plate 302 on the first substrate).

By hollowing out the second substrate, that is, providing an opening on the second substrate and providing a cover plate covering the opening, the first substrate and the second substrate can be assembled first, and the cover plate can be pre-processed before covering the opening of the second substrate, so that the substance on the cover plate is not affected by the process of assembling the first substrate and the second substrate.

It should be understood that the embodiments of the present disclosure are described by taking the microfluidic chip reaction region including two grooves as an example. Those skilled in the art can design the number of grooves in the reaction region and the number of openings in the second substrate according to actual needs. This disclosure does not limit in this regard.

Figure 6:
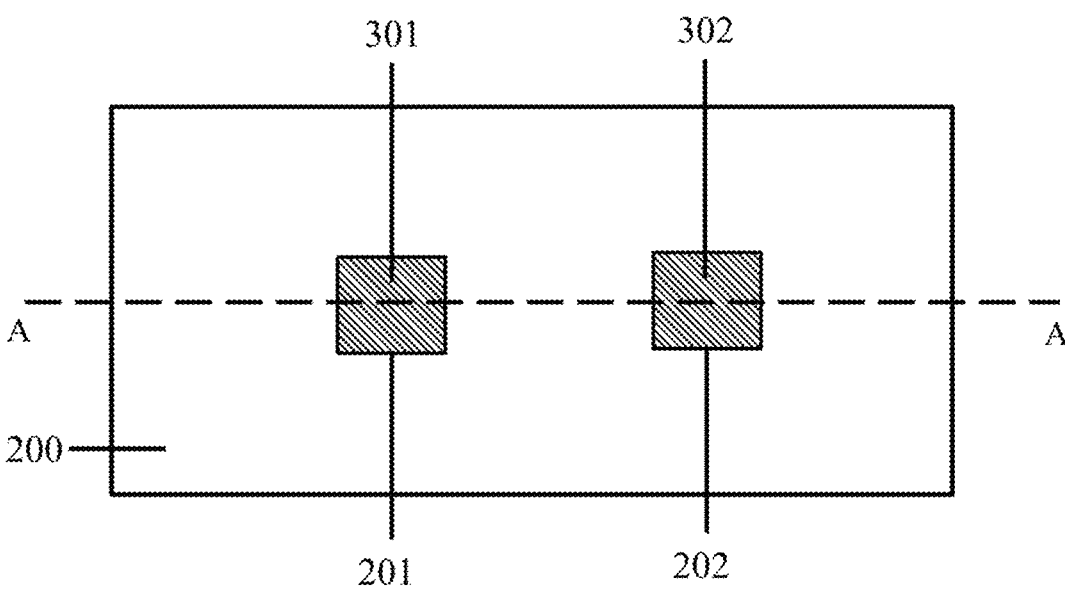
FIG. 6 schematically shows a top view of a second substrate and a cover plate according to an embodiment of the present disclosure.
Figure 7A:
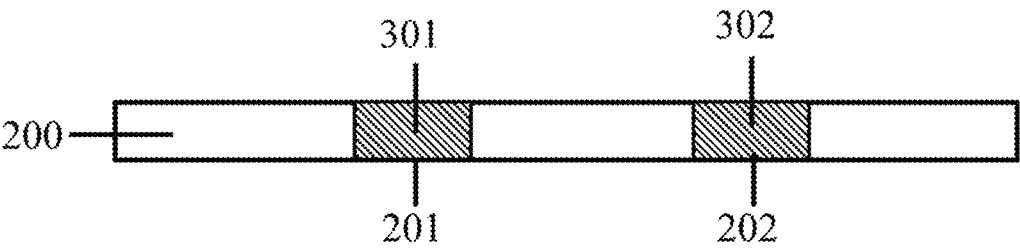
FIG. 7A schematically shows a cross-sectional view of the second substrate and the cover plate taken along line AA in FIG. 6.
Figure 7B:
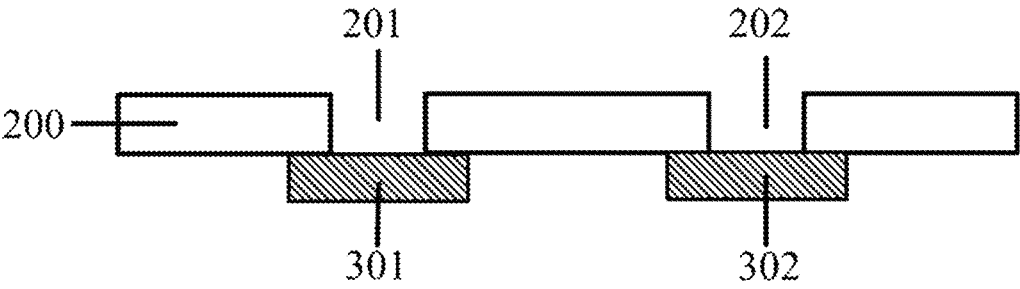
FIG. 7B schematically shows another cross-sectional view of a second substrate and a cover plate taken along line AA in FIG. 6.

FIG. 6 schematically shows a top view of a second substrate and a cover plate according to an embodiment of the present disclosure. Viewed in the direction from the first substrate to the second substrate, the first opening 201 and the second opening 202 are covered by the first cover plate 301 and the second cover plate 302, respectively. FIG. 7A and FIG. 7B schematically show cross-sectional views of the second substrate and the cover plate taken along the line AA in FIG. 6. In some embodiments, the cover plate may be embedded in the opening, as shown in FIG. 7A, the first cover plate may be embedded in the first opening 201, and the second cover plate 302 may be embedded in the second opening 202. In some embodiments, the cover plate may be arranged on the surface of the second substrate 200 away from the first substrate. As shown in FIG. 7B, the first cover plate 301 and the second cover plate 302 are arranged on the surface of the second substrate 200 away from the first substrate, the orthographic projection of the first cover plate 301 on the first substrate covers the first opening 201, and the orthographic projection of the second cover plate 302 on the first substrate covers the second opening 202.

In some embodiments, the orthographic projection of the reaction region on the first substrate may be within the orthographic projection of the opening on the first substrate. For example, the orthographic projection of the first groove of the reaction region on the first substrate is within the orthographic projection of the first opening on the first substrate, and the orthographic projection of the second groove of the reaction region on the first substrate is within the orthographic projection of the second opening on the first substrate. Thus, the substance to be tested flowing through the reaction region can fully contact with the substance on the cover plate. In some embodiments, the orthographic projection of the opening on the first substrate may be within the orthographic projection of the reaction region on the first substrate. For example, the orthographic projection of the first opening on the first substrate is within the orthographic projection of the first groove of the reaction region on the first substrate, the orthographic projection of the second opening on the first substrate is within the orthographic projection of the second groove of the reaction region on the first substrate, so that the substance on the cover plate can fully contact with the substance to be tested flowing through the reaction region. Those skilled in the art can reasonably design the shape and size of the reaction region and the opening according to actual needs. Optionally, the orthographic projection of the reaction region on the first substrate and the orthographic projection of the opening on the first substrate in the second direction may have the same width, and the two edges perpendicular to the second direction of the orthographic projection of the reaction region on the first substrate and the two edges perpendicular to the second direction of the orthographic projection of the opening on the first substrate coincide with each other. Further optionally, the orthographic projection of the reaction region on the first substrate and the orthographic projection of the opening on the first substrate may completely coincide.

Figure 8:
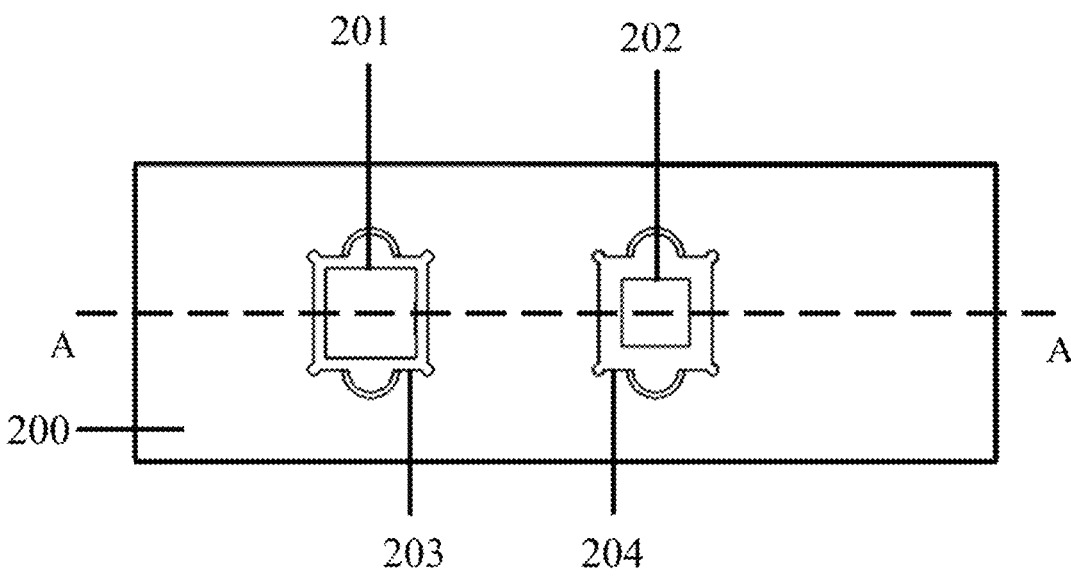
FIG. 8 schematically shows a top view of a second substrate and a cover plate according to an embodiment of the present disclosure.
Figure 9:
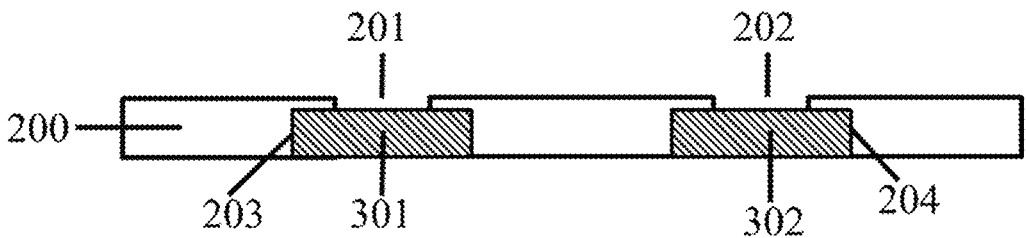
FIG. 9 schematically shows a cross-sectional view of a second substrate and a cover plate taken along line AA in FIG. 8.
Figure 10:
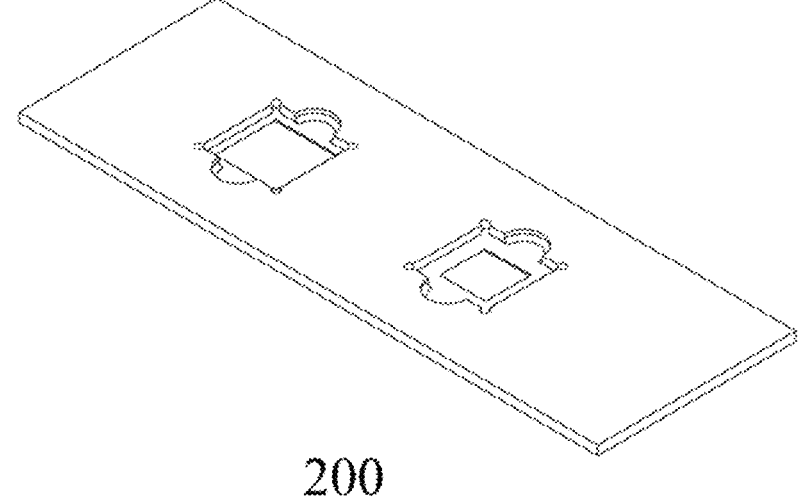
FIG. 10 schematically shows a stereoscopic structural view of a second substrate according to an embodiment of the present disclosure.

FIG. 8 schematically shows a top view of a second substrate and a cover plate according to an embodiment of the present disclosure. In this embodiment, the surface of the second substrate facing away from the first substrate is provided with a first recess 203 and a second recess 204, and the first opening 201 is in the first recess 203 (i.e., the orthographic projection of the first opening 201 on the first substrate is within the orthographic projection of the first recess 203 on the first substrate, and the second opening 112 is in the second recess 204 (that is, the orthographic projection of the second opening 202 on the first substrate is within the orthographic projection of the second recess 204 on the first substrate). FIG. 9 schematically shows a cross-sectional view of the second substrate and the cover plate taken along line AA in FIG. 8. As shown in FIG. 9, the first cover plate 301 is embedded in the first recess 203, and the second groove is embedded in the second recess 204. FIG. 10 schematically shows a stereoscopic structure diagram of the second substrate 200.

By providing recesses on the second substrate, the embedment of the cover plate can be made more convenient. For example, UV curing glue or die-cut double-sided glue can be coated on the recess to package the cover plate and the second substrate. Compared with the embodiment shown in FIG. 7A, the design of the recesses makes the packaging of the microfluidic chip more convenient, and at the same time can effectively prevent the reactants from seeping out. Compared with the embodiment shown in FIG. 7B, by designing the recesses, the height difference between the surface of the second substrate facing the first substrate and the surface of the cover plate facing the first substrate is reduced, thereby avoiding uniformity of the flow of samples in the reaction region. Therefore, by designing the recesses, not only the packaging of the microfluidic chip is more convenient, but also the reliability and detection stability of the microfluidic chip are improved.

In some embodiments, as shown in FIG. 7A, the surface of the second substrate facing the first substrate and the surface of the cover plate facing the first substrate may be in the same plane.

In some embodiments, as shown in FIG. 7B and FIG. 9, the surface of the second substrate facing the first substrate and the surface of the cover plate facing the first substrate may not be in the same plane.

In some embodiments, as shown in FIG. 8 and FIG. 10, the edges of the first recess 203 on opposite sides of the first opening 201 and the edges of the second recess 204 on opposite sides of the second opening 202 are designed as circular arcs, such as semicircular rings. This design makes the operation of the cover plates more convenient.

It should be noted that the arcs at the four corners of the first recess 203 and the second recess 204 in FIG. 8 and FIG. 10 are due to the inconvenience of machining orthogonal corners. Such a circular arc design can facilitate the processing of the recesses. Similarly, designing the opening of the second substrate to be square is also to facilitate processing and manufacturing, and those skilled in the art can reasonably design the shape of the opening according to the actual processing technology used.

In some embodiments, as shown in FIG. 9, the surface of the second substrate 200 away from the first substrate and the surface of the cover plates (the first cover plate 301 and the second cover plate 302) away from the first substrate may be in the same plane. In this way, the bottom surface of the microfluidic chip is flush and easy to lay flat.

In some embodiments, the first substrate and the second substrate may be made of polymer materials, such as polymethylmethacrylate (PMMA), polydimethylsiloxane, polycarbonate, polyethylene terephthalate, cyclic olefin copolymers, etc. The polymer material is easy to process, and it is easier to form the flow channels and various functional regions of the microfluidic chip.

In some embodiments, the cover plate may be glass. The glass surface is easy to be chemically modified. In immunoassay applications, after the glass surface is chemically modified, antibodies can be grafted onto the glass surface. A variety of capture antibodies can be pre-embedded on the glass by the sample applicator to perform multi-index joint inspection and improve the detection throughput.

It should be understood that the shape and ratio of the reaction region in the embodiments of the present disclosure are exemplary, and those skilled in the art can reasonably design the length-to-width ratio of the reaction region according to the actual chip size and the targeted application requirements.

In this disclosure, "upstream of a certain region" refers to the region through which liquid has flowed before reaching the certain region during the operation of the microfluidic chip, and "downstream of a certain region" refers to the region to which the liquid will flow after flowing through the certain region during the operation of the microfluidic chip.

Taking a microfluidic chip for immunofluorescence detection as an example, both the first substrate and the second substrate can be made of polymer materials, such as PMMA, and the cover plate can be made of glass. In this case, the antibody can be grafted onto the modified glass and then freeze-dried for storage. After the first substrate and the second substrate are thermocompression bonded, the cover plate can be attached to the second substrate. In this way, the freeze-drying of the antibody and the thermocompression bonding of the substrate can be carried out separately, avoiding the influence of the thermocompression bonding on the grafting and storage of the antibody.

FIG. 1 and FIG. 5 illustrate the reaction process of the microfluidic chip for immunofluorescence detection. The sample to be tested enters from the sample input hole 101, passes through the serpentine first mixing region 103, and then enters the first groove 1021 of the reaction region. The sample to be tested will react with the freeze-dried fluorescent antibody pre-embedded on the cover plate 301 corresponding to the first groove 1021, to re-dissolve the antibody, and the antigen and antibody specifically bind. After passing through the serpentine second mixing region 104, the antigen in the sample fully reacts with the fluorescent antibody. When the antigen-antibody pair reaches the second groove 1022 of the reaction region, it reacts with the capture antibody grafted on the cover plate 302 corresponding to the second groove 1022 to form a double antibody sandwich. After the reaction is completed, the buffer is pumped from the sample input hole 101 of the chip to wash the reacting region in order to wash away the fluorescent antibodies that have not been captured, and the waste liquid flows into the waste liquid region 106. The chip is placed under a fluorescence microscope for optical signal detection to determine the amount of antigen in the sample. This immune microfluidic chip has the advantages of high throughput, fast speed, simple operation and high degree of automation.

Figure 11:
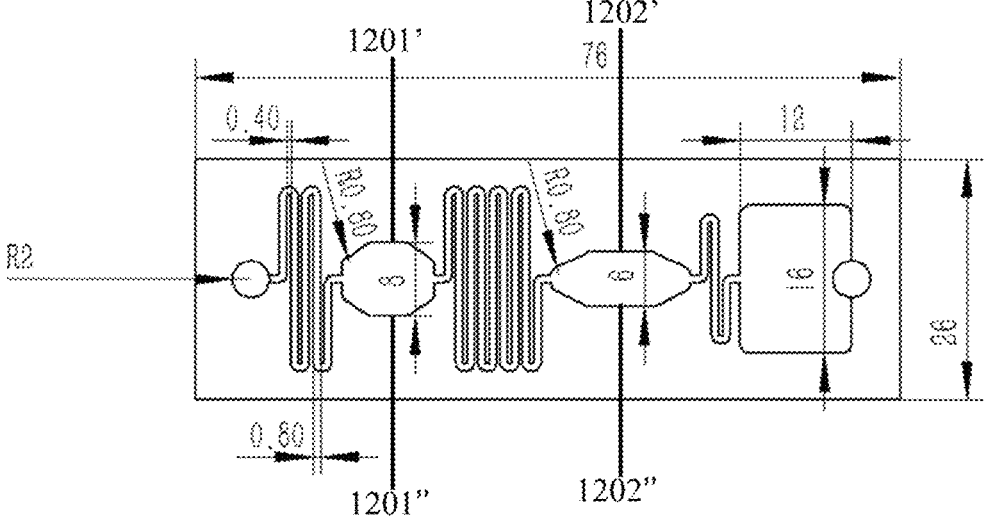
FIG. 11 schematically shows a dimensional diagram of a first substrate according to an embodiment of the present disclosure.
Figure 12:
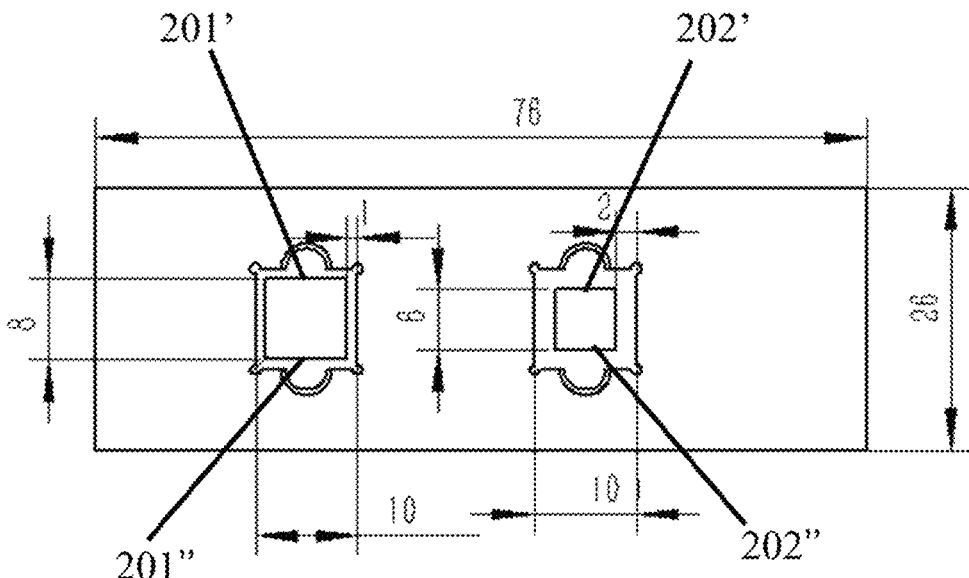
FIG. 12 schematically shows a dimensional diagram of a second substrate according to an embodiment of the present disclosure.

FIG. 11 schematically shows a dimensional view of the first substrate according to an embodiment of the present disclosure. FIG. 12 schematically shows a dimensional view of the second substrate corresponding to the first substrate shown in FIG. 11. As shown in FIG. 11 and FIG. 12, the length of the first substrate and the second substrate can be 76 mm, the width can be 26 mm, the sample input hole and the sample output hole can be via holes with a diameter of 2 mm, the width of the flow channel in the first mixing region and the second mixing region can be 0.8 mm, and the gap between adjacent flow channels can be 0.4 mm. Each corner of the hexagonal reaction region can have a chamfered arc with a radius of 0.80 mm. The width of the first groove of the reaction region at the widest point in the second direction may be 8 mm, the width of the second groove of the reaction region at the widest point in the second direction may be 6 mm, and the depth of the reaction region may be 0.2 mm. The first opening of the first substrate may be a square with a side length of 8 mm, and the second opening may be a square with a side length of 6 mm. The distance between the edge of the first recess without an arc and the edge of the first opening may be 1 mm, the distance between the edge of the second recess without an arc and the edge of the second opening may be 2 mm, and the depth of the first recess and the second recess may be 1 mm. When the first substrate shown in FIG. 11 and the second substrate shown in FIG. 2 are assembled, the two edges (1021', 1021") of the first groove of the reaction region in the second direction and the two edges (201', 201") of the first opening in the second direction are aligned, and the two edges (1022', 1022") of the second groove of the reaction region in the second direction and the two edges (202', 202") of the second opening in the second direction are aligned. After assembled in this way, the orthographic projection of the two opposite edges of the first groove of the reaction region in the second direction on the first substrate in the first direction and the orthographic projection of the two opposite edges of the first opening in the second direction on the first substrate in the first direction coincide, and the orthographic projection of the two opposite edges of the second groove of the reaction region in the second direction on the first substrate in the first direction and the orthographic projection of the two opposite edges of the second opening in the second direction on the first substrate in the first direction coincide. In the case that the shapes of the reaction region and the opening are inconsistent, by making the two edges of the reaction region in the second direction and the two edges of the opening in the second direction coincide with each other, both the adequate contact of the substance to be tested and the substance on the cover plate and the uniformity of the flow of the substance to be tested can be ensured.

Figure 13:
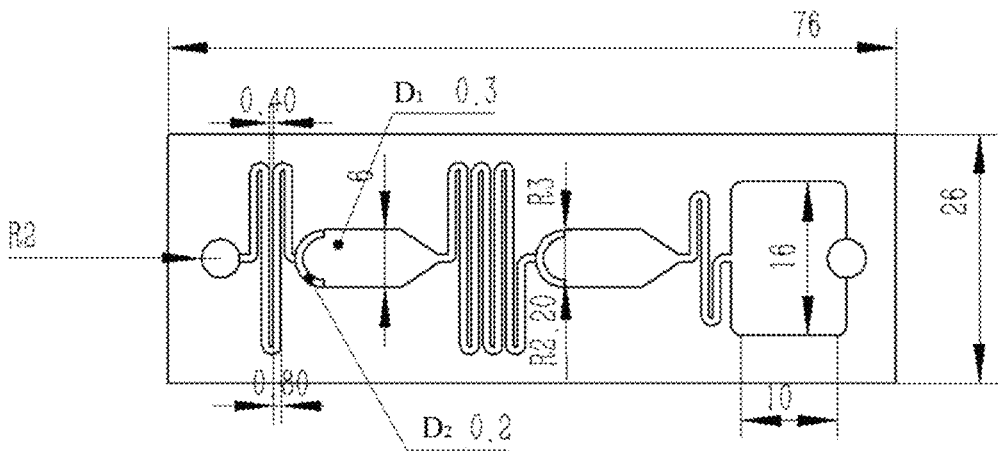
FIG. 13 schematically shows a dimensional diagram of a first substrate according to an embodiment of the present disclosure.
Figure 14:
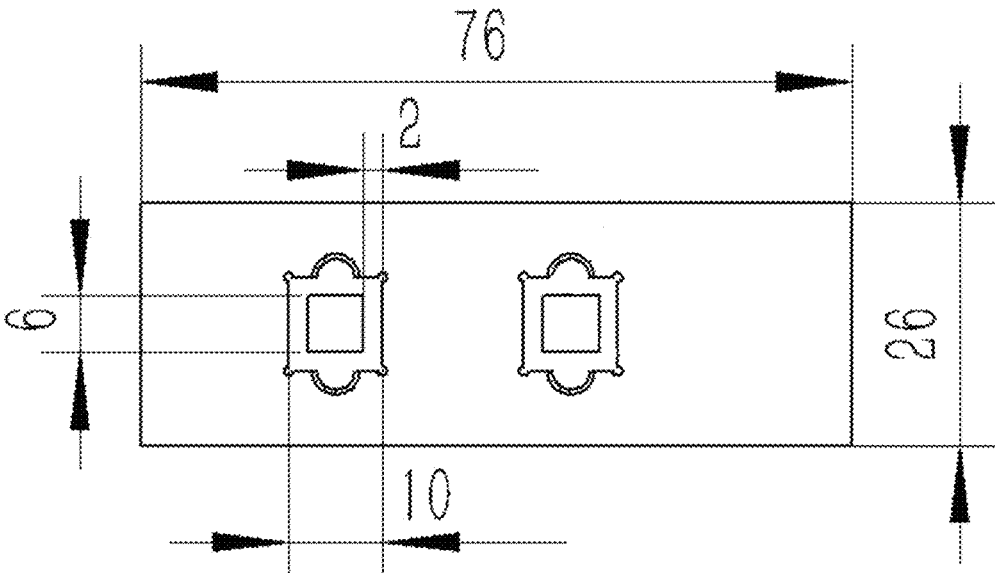
FIG. 14 schematically shows a dimensional diagram of a second substrate according to an embodiment of the present disclosure.

FIG. 13 schematically shows a dimensional view of the first substrate of the embodiment shown in FIG. 4. FIG. 14 schematically shows a dimensional view of the second substrate corresponding to the first substrate shown in FIG. 13. As shown in FIG. 13 and FIG. 14, both the first opening and the second opening can be a square with a side length of 6 mm, and the distance between the edges of the first and second recesses without arcs and the edges of the first and second openings may be 2 mm. The inner diameter of the semicircular ring may be 2.2 mm, and the outer diameter of the semicircular ring may be 3 mm. The depth $D_1$ of the reaction region may be 0.3 mm, and the depth $D_2$ of the semicircular ring may be 0.2 mm. With this design, the bubbles in the reaction region can be further reduced, the liquid advancing surface is nearly flat, and the liquid flow is more uniform, then the detection accuracy of the microfluidic chip is further improved.

In the description of the present disclosure, the terms "above", "below", "left", "right", etc. indicate the location or positional relationship based on the location or positional relationship shown in the drawings, and are only used to facilitate the description of the present disclosure. It is not required that the present disclosure must be constructed and operated in a specific location, and therefore cannot be understood as a limitation to the present disclosure.

In the description of this specification, the description with reference to the terms "one embodiment", "another embodiment", etc. means that a specific feature, structure, material, or characteristic described in conjunction with the embodiment is included in at least one embodiment of the present disclosure. In this specification, the schematic representations of the above terms do not necessarily refer to the same embodiment or example. Moreover, the described specific features, structures, materials or characteristics can be combined in any one or more embodiments or examples in a suitable manner. In addition, those skilled in the art can combine different embodiments or examples and features of different embodiments or examples described in this specification without contradicting each other. In addition, it should be noted that in this specification, the terms "first", "second", etc. are only used for descriptive purposes, and cannot be understood as indicating or implying relative importance or implicitly indicating the number of indicated technical features.

As those skilled in the art will understand, although the various steps of the method in the present disclosure are described in a specific order in the accompanying drawings, this does not require or imply that these steps must be performed in the specific order, unless the context clearly indicates otherwise. Additionally or alternatively, multiple steps can be combined into one step for execution, and/or one step can be decomposed into multiple steps for execution. In addition, other method steps can be inserted between the steps. The inserted step may represent an improvement of the method such as described herein, or may be unrelated to the method. In addition, a given step may not be fully completed before the next step starts.

The above embodiments are only used for explanations rather than limitations to the present disclosure, the ordinary skilled person in the related technical field, in the case of not departing from the spirit and scope of the present disclosure, may also make various modifications and variations, therefore, all the equivalent solutions also belong to the scope of the present disclosure, and the patent protection scope of the present disclosure should be defined by the claims. Other variations to the disclosed embodiments can be understood and effected by those skilled in the art in practicing the claimed invention, from a study of the drawings, the disclosure, and the appended claims. In the claims, the word "comprising" does not exclude other elements or steps, and the terms "a", "an" and "the" in the singular form do not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A microfluidic chip, comprising a first substrate, the first substrate comprising:

a sample input hole; and a reaction region located downstream of the sample input hole, wherein the reaction region comprises at least one groove, a shape of the at least one groove is an axisymmetric pattern, a width of the axisymmetric pattern in a first direction is not less than a width of the axisymmetric pattern in a second direction, and the first direction is perpendicular to the second direction, the microfluidic chip further comprises:

a second substrate disposed opposite to the first substrate, the second substrate comprising an opening penetrating the second substrate; and a cover plate on a side of the second substrate away from the first substrate, wherein the reaction region is exposed by the opening, and the opening is covered by the cover plate on the side of the second substrate away from the first substrate.

2. The microfluidic chip according to claim 1, wherein the reaction region comprises at least two grooves, and shapes of the at least two grooves are different.

3. The microfluidic chip according to claim 1, wherein the reaction region comprises at least two grooves, and shapes of the at least two grooves are same.

4. The microfluidic chip according to claim 1, wherein a shape of the reaction region comprises a first axisymmetric pattern and a second axisymmetric pattern, and a width of the first axisymmetric pattern in the first direction is less than a width of the second axisymmetric pattern in the first direction.

5. The microfluidic chip according to claim 4, wherein a width of the first axisymmetric pattern in the second direction is greater than a width of the second axisymmetric pattern in the second direction.

6. The microfluidic chip according to claim 1, wherein the axisymmetric pattern comprises a polygon and a circle.

7. The microfluidic chip according to claim 1, wherein an end of the axisymmetric pattern close to the sample input hole comprises a semicircular ring shape.

8. The microfluidic chip according to claim 1, wherein the first substrate further comprises a mixing region located downstream of the sample input hole, and the mixing region comprises a serpentine flow channel.

9. The microfluidic chip according to claim 8, wherein the reaction region comprises a first groove and a second groove, and the mixing region comprises a first mixing region located upstream of the first groove and a second mixing region located upstream of the second groove.

10. The microfluidic chip according to claim 9, wherein a length of a flow channel of the second mixing region is greater than a length of a flow channel of the first mixing region.

11. The microfluidic chip according to claim 1, wherein the first substrate further comprises a waste liquid region and a sample output hole, the waste liquid region being downstream of the reaction region and upstream of the sample output hole.

12. The microfluidic chip according to claim 11, wherein, a shape of the waste liquid region is a rectangle.

13. The microfluidic chip according to claim 1, wherein two opposite edges of the reaction region in the second direction are aligned with two opposite edges of the opening in the second direction.

14. The microfluidic chip according to claim 1, wherein a surface of the second substrate facing away from the first substrate comprises a recess, the opening is in the recess, and the cover plate is in the recess.

15. The microfluidic chip according to claim 1, wherein the shape of the opening comprises a square.

16. The microfluidic chip according to claim 1, wherein a material of the cover plate comprises a chemically modified material.

17. The microfluidic chip according to claim 1, wherein a surface of the second substrate facing the first substrate and a surface of the cover plate facing the first substrate are in a same plane.

18. The microfluidic chip according to claim 1, wherein a surface of the second substrate facing the first substrate and a surface of the cover plate facing the first substrate are not in a same plane.

19. The microfluidic chip according to claim 14, wherein the recess of the second substrate comprises arc-shaped edges on opposite sides of the opening.

* * * * *